United States Patent
Huang et al.

(10) Patent No.: US 12,334,956 B2
(45) Date of Patent: Jun. 17, 2025

(54) DATA PROCESSING SYSTEM AND DATA PROCESSING METHOD FOR DEEP NEURAL NETWORK MODEL

(71) Applicant: Industrial Technology Research Institute, Hsinchu (TW)

(72) Inventors: Yu-Chih Huang, Hsinchu (TW); Li-Yang Tseng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 29 days.

(21) Appl. No.: 18/522,242

(22) Filed: Nov. 29, 2023

(65) Prior Publication Data

US 2024/0204804 A1 Jun. 20, 2024

Related U.S. Application Data

(60) Provisional application No. 63/433,020, filed on Dec. 16, 2022.

(30) Foreign Application Priority Data

Oct. 6, 2023 (TW) ................................. 112138426

(51) Int. Cl.
*H03M 13/27* (2006.01)
*H03M 13/00* (2006.01)
*H04L 1/00* (2006.01)

(52) U.S. Cl.
CPC ....... *H03M 13/27* (2013.01); *H03M 13/6577* (2013.01); *H04L 1/0041* (2013.01); *H04L 1/0045* (2013.01); *H04L 1/0071* (2013.01)

(58) Field of Classification Search
CPC ...... H03M 7/70; H03M 7/6041; H03M 13/27; H03M 13/6577; H04L 1/0041; H04L 1/0045; H04L 1/0071
See application file for complete search history.

(56) References Cited

U.S. PATENT DOCUMENTS

| 10,917,662 B2 | 2/2021 | Wu et al. |
| 11,049,013 B1 | 6/2021 | Duong et al. |

(Continued)

FOREIGN PATENT DOCUMENTS

| CN | 113225114 | 3/2022 |
| TW | I745697 | 11/2021 |
| WO | 2021182878 | 9/2021 |

OTHER PUBLICATIONS

Wess et al., Weighted Quantization-Regularization in DNNs for weight memory minimization towards HW implementation, IEEE Trans. on Computer-Aided Design of Integrated Circuits and Systems, vol. 27, No. 11, Nov. 2018, pp. 2929 to 2939. (Year: 2018).*

(Continued)

*Primary Examiner* — Shelly A Chase
(74) *Attorney, Agent, or Firm* — JCIPRNET

(57) ABSTRACT

A data processing method for a DNN model includes: reading weights of transmission data; quantizing each weight into bits sequentially including first, second, third, and fourth-type bits; sequentially interleaving the first-type bit into a first bit set; sequentially interleaving each second-type bit into second bit sets and reading a second compression rate of each second bit set in response to the compressible second bit sets; interleaving the third-type bit into a third bit set and reading a third compression rate of the third bit set in response to the compressible third bit set; compressing each second bit set with the second compression rate, and compressing the third bit set with the third compression rate; sequentially coding the first bit set, each compressed second bit set, and the compressed third bit set to generate first encoded data corresponding to the transmission data; transmitting the first encoded data to an external device.

14 Claims, 5 Drawing Sheets

(56) References Cited

U.S. PATENT DOCUMENTS

| | | |
|---|---|---|
| 11,210,586 B1 | 12/2021 | Duong et al. |
| 2017/0302353 A1 | 10/2017 | Rahman et al. |
| 2020/0302299 A1 | 9/2020 | Nagel et al. |
| 2021/0125070 A1 | 4/2021 | Wang et al. |
| 2021/0209474 A1 | 7/2021 | Duan et al. |
| 2021/0351788 A1* | 11/2021 | Jun .................... H03M 7/70 |
| 2022/0121949 A1 | 4/2022 | Chang et al. |
| 2022/0147792 A1 | 5/2022 | Jiao et al. |
| 2022/0318633 A1 | 10/2022 | Kim et al. |

OTHER PUBLICATIONS

Kulkarni et al., A survey on Quantization Methods for Optimization of Deep Neural Networks, IEEE, Proceedings on the International Conference on Automation, Computing and Renewable Systems, (ICACRS 2022), Dec. 13-15, 2022, pp. 827 to 834. (Year: 2022).*

Liang et al., Pruning and Quantization for Deep Neural Network Acceleration: A Survey, ArXiv:2101.09671v3, Jun. 15, 2022, pp. 1 to 41. (Year: 2022).*

Simon Wiedemann et al., "DeepCABAC: A Universal Compression Algorithm for Deep Neural Networks", IEEE Journal of Selected Topics in Signal Processing, Jan. 24, 2020, pp. 700-714, vol. 14, No. 4.

Hang Lu et al., "Distilling Bit-level Sparsity Parallelism for General Purpose Deep Learning Acceleration", Micro '21: Micro-54: 54th Annual IEEE/ACM International Symposium on Microarchitecture, Oct. 18, 2021, pp. 963-976.

"Search Report of Europe Counterpart Application", issued on May 23, 2024, p. 1-p. 12.

Ritchie Zhao et al., "Improving Neural Network Quantization without Retraining using Outlier Channel Splitting", arXiv:1901.09504v3 [cs.LG], May 22, 2019, pp. 1-10.

Jangho Kim et al., "Position-based Scaled Gradient for Model Quantization and Pruning", NIPS'20: Proceedings of the 34th International Conference on Neural Information Processing Systems, Nov. 11, 2020, pp. 1-19.

Kunping Huang et al., "Improve Robustness of Deep Neural Networks by Coding", 2020 Information Theory and Applications Workshop (ITA), Feb. 2020, pp. 1-7.

Markus Nagel et al., "Up or Down? Adaptive Rounding for Post-Training Quantization", ICML'20: Proceedings of the 37th International Conference on Machine Learning, Jul. 2020, pp. 1-10.

Markus Nagel et al., "Data-Free Quantization Through Weight Equalization and Bias Correction", 2019 IEEE/CVF International Conference on Computer Vision (ICCV), Nov. 25, 2019, pp. 1-13.

Mart Van Baalen et al., "Bayesian Bits: Unifying Quantization and Pruning", NIPS'20: Proceedings of the 34th International Conference on Neural Information Processing Systems, Oct. 27, 2020, pp. 1-26.

Jangho Kim et al., "PQK: Model Compression via Pruning, Quantization, and Knowledge Distillation", Proceedings of Interspeech 2021, Jun. 25, 2021, pp. 1-5.

"Office Action of Taiwan Counterpart Application", issued on Apr. 30, 2024, p. 1-p. 5.

* cited by examiner

DATA PROCESSING SYSTEM AND DATA PROCESSING METHOD FOR DEEP NEURAL NETWORK MODEL

CROSS-REFERENCE TO RELATED APPLICATION

This application claims the priority benefit of U.S. provisional application Ser. No. 63/433,020, filed on Dec. 16, 2022, and Taiwan application serial no. 112138426, filed on Oct. 6, 2023. The entirety of each of the above-mentioned patent applications is hereby incorporated by reference herein and made a part of this specification.

TECHNICAL FIELD

The disclosure relates to a data processing system and a data processing method for a deep neural network (DNN) model.

BACKGROUND

In the realm of B5G/6G communications, the convergence of artificial intelligence (AI) and machine learning (ML) has emerged as a dominant trend. This convergence is characterized by the exchange and sharing of substantial model information between transmitting and receiving ends through wireless communication techniques. In this context, a deep neural network (DNN) has emerged as a primary driver behind the recent achievements of ML across diverse applications.

However, the realization of such accomplishments frequently requires the utilization of large and intricate DNN models, encompassing millions or even billions of parameters. Such a characteristic poses a notable challenge concerning the storage and transmission of the voluminous DNN models. Beyond the considerable memory requirements for DNN model storage, the compression of parameters becomes imperative when transmitting them through noisy channels, with compression techniques often reducing the bit precision (e.g., compressing from 32 bits to 4 bits or 8 bits). Such compression may potentially impact accuracy and introduce the risk of errors in the transmitted models.

Consequently, one of the challenges to address lies in the effective compression of data while preserving model accuracy during the transmission of the DNN models.

SUMMARY

One of the exemplary embodiments provides a data processing system that includes a memory and a processor. The memory is configured to store a deep neural network (DNN) model, and the processor is coupled to the memory and configured to perform following steps. A plurality of weights are read from a transmission data of the DNN model. Each of the weights is quantized into a plurality of bits, where the bits sequentially include a first-type bit, a plurality of second-type bits, a third-type bit, and a plurality of fourth-type bits. The first-type bit in each of the weights is interleaved into a first bit set. Each of the second-type bits in each of the weights is sequentially interleaved into a plurality of second bit sets, and a second compression rate of each of the second bit sets is read in response to the second bit sets being compressible. The third-type bit in each of the weights is interleaved into a third bit set, and a third compression rate of the third bit set is read in response to the third bit set being compressible. Each of the second bit sets is compressed with the second compression rate, and the third bit set is compressed with the third compression rate. The first bit set, each of the compressed second bit sets, and the compressed third bit set are sequentially coded to generate a first encoded data corresponding to the transmission data. The first encoded data are transmitted to an external device via a network.

In an embodiment of the disclosure, the processor is further configured to receive a second encoded data from the external device, decode the second encoded data to generate the first bit set, the compressed second bit sets, and the compressed third bit set, decompress each of the compressed second bit sets and the compressed third bit set, sequentially de-interleave the first bit set, each of the second bit sets, and the third bit set, and reconstruct a plurality of de-interleaved bits generated after the first bit set, each of the second bit sets, and the third bit set are de-interleaved as a plurality of reconstructed weights.

In an embodiment of the disclosure, the first-type bit is a most significant bit.

In an embodiment of the disclosure, the processor is further configured to quantize each of the weights into the bits based on an IEEE standard 754 for binary floating-point arithmetic (IEEE 754).

In an embodiment of the disclosure, the first-type bit is a sign bit.

In an embodiment of the disclosure, the second-type bits and the third-type bit are exponent bias bits.

In an embodiment of the disclosure, the memory is further configured to store a compression rate data, and the processor is further configured to dynamically determine whether the second bit sets and the third bit set are compressible based on the compression rate data and a distribution condition of 0s and 1s in each of the second bit sets and the third bit set, and read the second compression rate and the third compression rate, where the compression rate data include historical statistics.

One of the exemplary embodiments provides a data processing method for a DNN model, and the data processing method includes following steps. A plurality of weights are read from a transmission data. Each of the weights is quantized into a plurality of bits, where the bits sequentially include a first-type bit, a plurality of second-type bits, a third-type bit, and a plurality of fourth-type bits. The first-type bit in each of the weights is interleaved into a first bit set. Each of the second-type bits in each of the weights is sequentially interleaved into a plurality of second bit sets, and a second compression rate of each of the second bit sets is read in response to the second bit sets being compressible. The third-type bit in each of the weights is interleaved into a third bit set, and a third compression rate of the third bit set is read in response to the third bit set being compressible. Each of the second bit sets is compressed with the second compression rate, and the third bit set is compressed with the third compression rate. The first bit set, each of the compressed second bit sets, and the compressed third bit set are sequentially coded to generate first encoded data corresponding to the transmission data. The first encoded data are transmitted to an external device.

In light of the foregoing, the data processing system and the data processing method for the DNN model, as provided in one or more embodiments of the disclosure, incorporate techniques such as quantization, block-interleaving, lossless compression, channel coding, and the like. These techniques may achieve prediction accuracy similar to that of an original network model while optimizing the utilization of resources for storing/transmitting the DNN model.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

DETAILED DESCRIPTION OF DISCLOSURED EMBODIMENTS

Some embodiments of the disclosure will be described in detail in conjunction with the accompanying drawings. Reference numbers referred to in the following description are considered as denoting the same or similar components when the same reference numbers appear in different drawings. These embodiments should be construed as part of the disclosure and do not reveal all possible implementations of the disclosure.

According to findings from statistical analysis, when parameters in one of layers of a four-layer fully connected DNN model with an MNIST dataset are represented using a 32-bit representation of an IEEE standard 754 for binary floating-point arithmetic (IEEE 754), the probability of a binary value of each bit being 1 or 0 is associated with the position of the bit. When the DNN model is transmitted, in order to save the bandwidth occupied by wireless transmission for sharing and exchanging, the parameters are compressed first. Therefore, through the findings from the statistical analysis, four types of bits are initially identified: bits that exhibit incompressibility and require protection, bits that have the potential for substantial compression but do not necessitate protection, bits that are compressible and require protection, and bits that pose challenges for compression but do not necessitate protection. By employing an interleaving module or an interleaving process, bits of different types are interleaved, and then subsequent compression and coding processes are executed to diminish dimensions of the transmission parameters and alleviate the transmission-related burden.

A data processing system and a data processing method provided in one or more embodiments of the disclosure may be applied to determine whether each bit is compressible and compress the bits that are compressible. For explanatory purposes, in the disclosure, bits that exhibit incompressibility and require protection are referred to as first-type bits, bits that have the potential for substantial compression but do not necessitate protection are referred to as second-type bits, bits that are compressible and require protection are referred to as third-type bits, and bits that pose challenges for compression but do not necessitate protection and may be even ignored are referred to as fourth-type bits.

Figure 1:
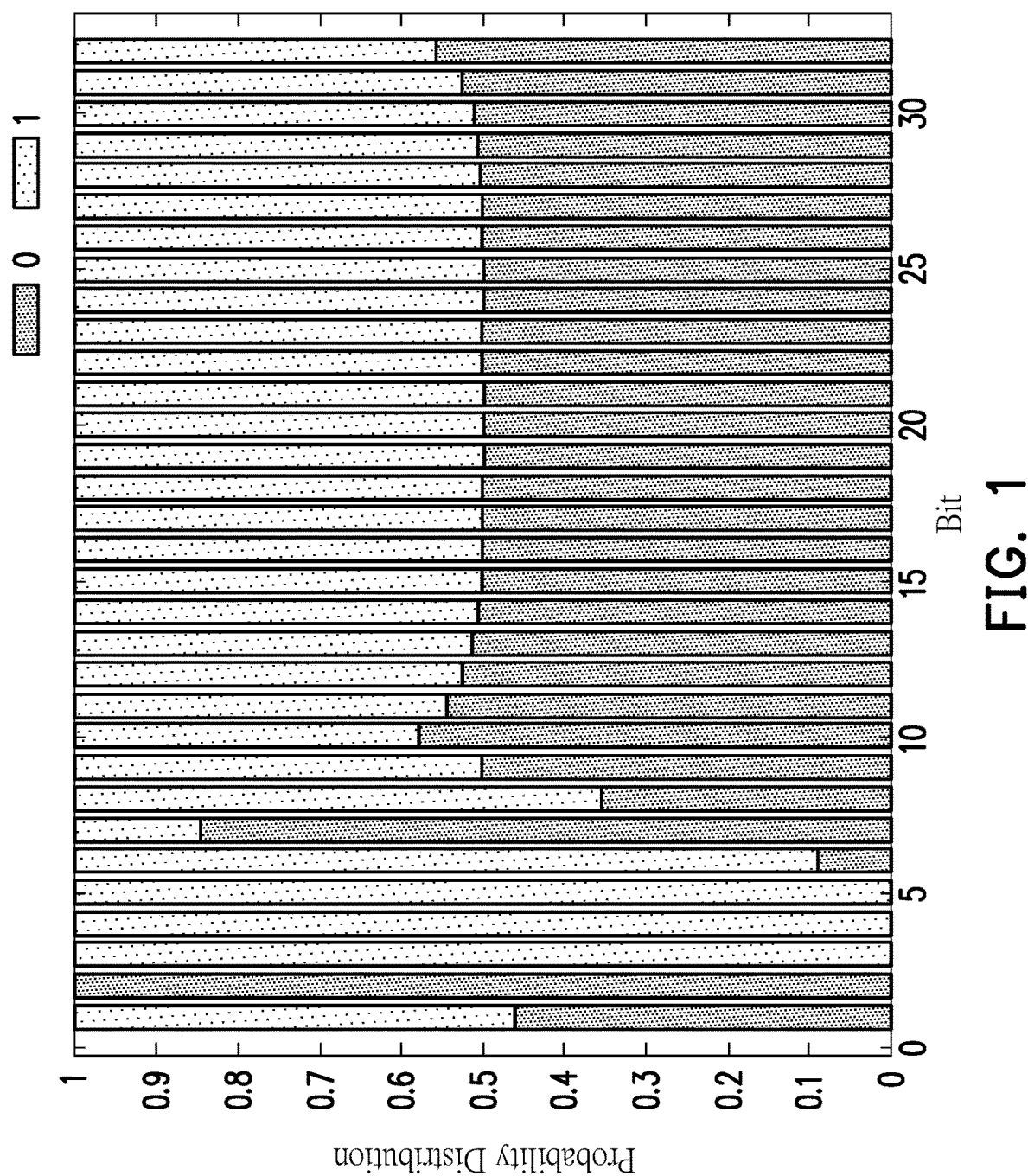
FIG. 1 is a probability distribution diagram illustrating a binary value of each bit as 1 or 0 in an IEEE 754 32-bit representation of parameters in one of layers of a four-layer fully connected DNN model with an MNIST dataset.

FIG. 1 is a probability distribution diagram illustrating a binary value of each bit as 1 or 0 in an IEEE 754 32-bit representation of parameters in one of layers of a four-layer fully connected DNN model with an MNIST dataset. With reference to FIG. 1, the first bit is a sign bit, with a 50% probability of being 1 or 0, and since the first bit is the sign bit, it is extremely important in the parameters and is categorized as the first-type bits that exhibit incompressibility and require protection. The second bit to the fifth bit are exponent bias bits, with a 100% probability of being 1 or 0, and the exponent bias bits are crucial in the parameters and are categorized as the second-type bits that have the potential for substantial compression but do not necessitate protection. The sixth bit is also an exponent bias bit, with a 10% probability of being 0 and a 90% probability of being 1, and the sixth bit is important in the parameters and categorized as the third-type bit that are compressible and require protection. The seventh bit to the thirty-second bit are also some exponent bias bits and fractions, with the lowest importance in the parameters, and these bits are categorized as the fourth-type bits that pose challenges for compression but do not necessitate protection and may even be omitted from transmission.

It should be specifically mentioned that the probability distribution diagram in FIG. 1 contains statistical results of one of the layers in the four-layer fully connected DNN model with the MNIST dataset. For instance, the second bit to the fifth bits are the second-type bits, and the sixth bit is the third-type bit, but in other layers of the DNN model, the statistical results may vary, such as the second to the sixth bits being the second-type bits, and the seventh bit being the third-type bit. However, a large amount of statistical data shows that, despite slight differences in the probability distribution of binary values of bits being 1 or 0 in different networks, different layers, different compression modules, and different datasets, the probability distributions are all similar to the probability distribution shown in FIG. 1. Based on such probability distribution characteristics, in addition to performing steps such as quantization and channel coding, the data processing system and the data processing method for the DNN model provided in one or more embodiments of the disclosure are further applied to perform steps such as interleaving and compression (source coding) to process the transmission data of the DNN model.

Figure 2:
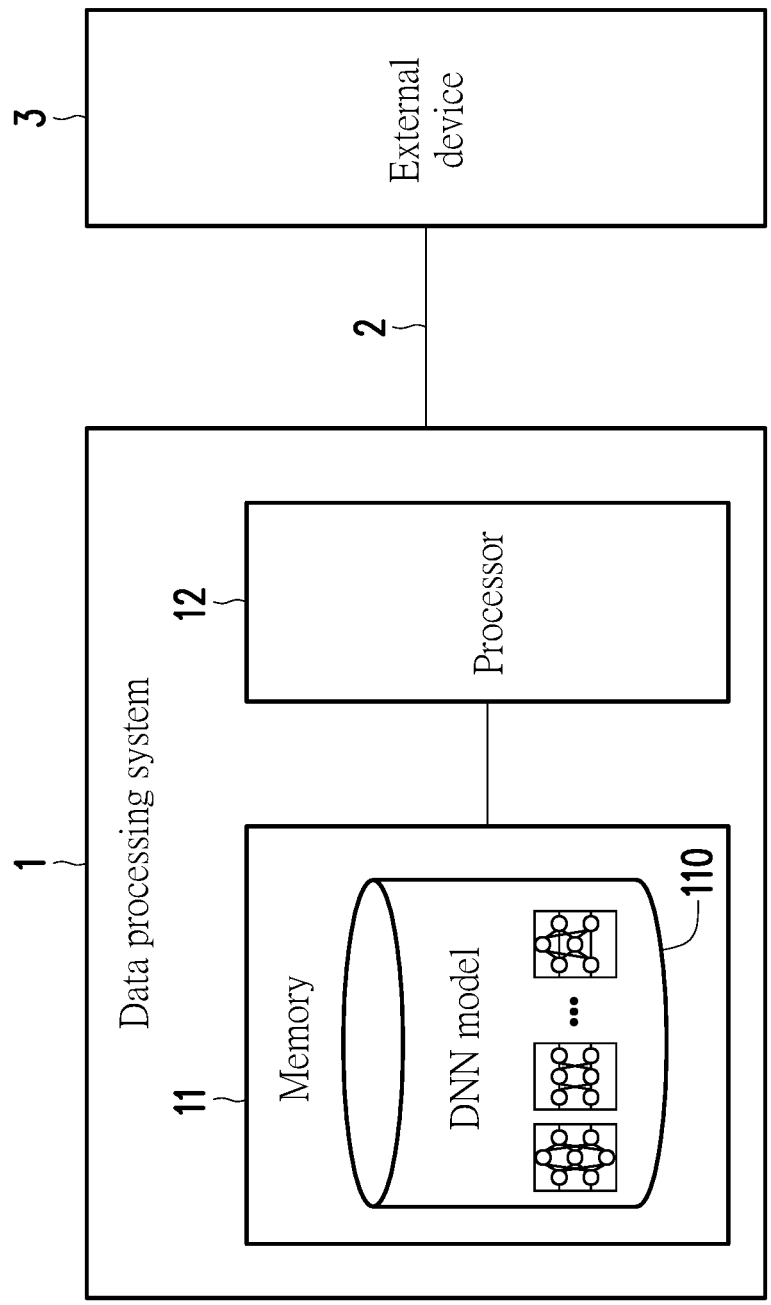
FIG. 2 is a schematic diagram illustrating an architecture of a data processing system according to an embodiment of the disclosure.

FIG. 2 is a schematic diagram illustrating an architecture of a data processing system 1 according to an embodiment of the disclosure. With reference to FIG. 2, the data processing system 1 includes a memory 11 and a processor 12. The memory 11 is configured to store a DNN model 110, and the processor 12 is coupled to the memory 11.

Practically, the data processing system 1 may be implemented by a computer device, such as a desktop computer, a laptop computer, a tablet computer, a workstation, or any other computer device with computing, display, and networking functions, which should however not be construed as a limitation in the disclosure. The memory 11 may be a static random access memory (SRAM), a dynamic random access memory (DRAM), or any other type of memory. The processor 12 may be a central processing unit (CPU), a microprocessor, or an embedded controller, which should however not be construed as a limitation in the disclosure.

Figure 3:
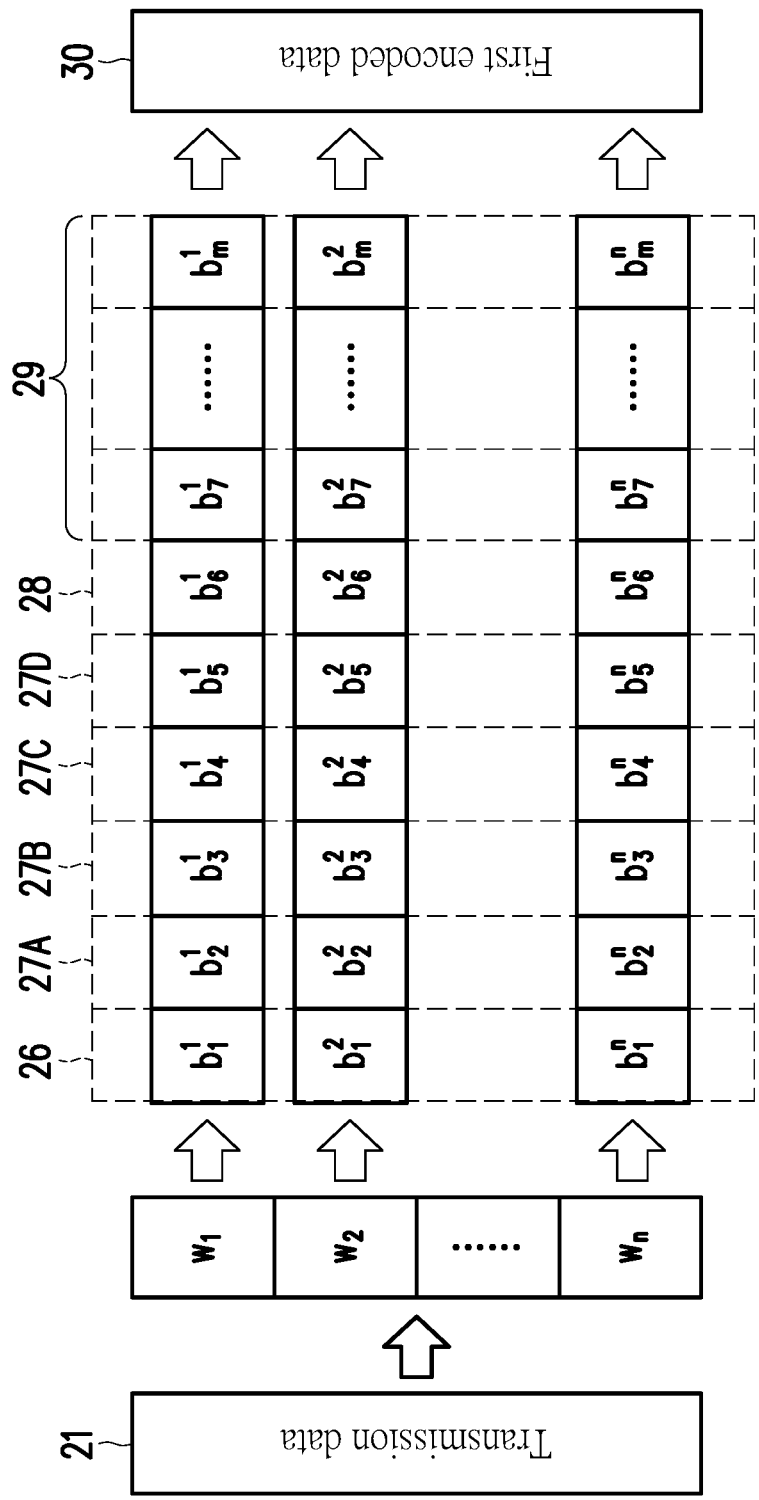
FIG. 3 is a schematic diagram illustrating the processing of a transmission data by the data processing system depicted in FIG. 2.

FIG. 3 is a schematic diagram illustrating the processing of a transmission data 21 by the data processing system 1 depicted in FIG. 2. With reference to FIGS. 2 and 3, the processor 12 reads n weights $W_1, W_2, \ldots,$ and $W_n$ from the transmission data 21 of the DNN model 110.

Next, the processor 12 quantizes each of the weights $W_1$, $W_2, \ldots,$ and $W_n$ into m bits. Specifically, the processor 12 quantizes the weight $W_1$ into m bits $b_1^1, b_2^1, b_3^1, \ldots, b_m^1$, quantizes the weight $W_2$ into m bits $b_1^2, b_3^2, \ldots, b_m^2$, and the rest may be deduced therefrom until the weight $W_1$ is quantized into m bits $b_1^n, b_2^n, b_3^n, \ldots, b_m^n$.

For instance, in FIG. 3, among the m bits $b_1^1, b_2^1, b_3^1, \ldots, b_m^1$ which are obtained by quantizing the weight $W_1$, the first bit $b_1^1$ is the first-type bit, the second bit $b_1^2$ to the fifth bit $b_5^1$ are the second-type bits, the sixth bit $b_6^1$ is the third-type bit, and the seventh bit $b_7^1$ to the $m^{th}$ bit $b_m^1$ are the fourth-type bits. Similarly, the m bits obtained by quantizing each of the weights $W_2 \ldots,$ and $W_n$ are also categorized into four types. Here, the category of the bits contained in each of the first-type to the fourth-type bits serves as an embodiment and should however not be construed as a limitation in the disclosure. As long as the bits exhibit incompressibility and require protection, they are referred to as the first-type bits in the disclosure. The bits that have the potential for substantial compression but do not necessitate protection are referred to as the second-type bits in the disclosure. The bits that are compressible and require protection are referred to as the third-type bits in the disclosure. The bits that pose challenges for compression but do not necessitate protection or may even be ignored are referred to as the fourth-type bits in the disclosure.

After the processor 12 quantizes each of the weights $W_1$, $W_2, \ldots,$ and $W_n$ into a plurality of bits, the processor 12 interleaves the first-type bits (the first bits) in each of the weights $W_1, W_2, \ldots,$ and $W_n$ into a first bit set 26. The processor 12 determines whether the first bit set 26 is compressible. Since all the first bits in the first bit set 26 are the first-type bits that exhibit incompressibility and require protection, the processor 12 does not compress the first bit set 26. Generally, the first bits are the most significant bits.

Similarly, the processor 12 sequentially interleaves each of the second-type bits (e.g., the second bit to the fifth bit) in each of the weights $W_1, W_2, \ldots,$ and $W_n$ into a plurality of second bit sets. For instance, the processor 12 interleaves the second bit $b_2^1, b_2^2, \ldots,$ and $b_2^n$ in each of the weights $W_1, W_2, \ldots,$ and $W_n$ into a second bit set 27A, interleaves the third bit $b_3^1, b_3^2, \ldots,$ and $b_3^n$ in each of the weights $W_1$, $W_2, \ldots,$ and $W_n$ into a second bit set 27B, interleaves the fourth bit $b_4^1, b_4^2, \ldots,$ and $b_4^n$ in each of the weights $W_1$, $W_2, \ldots,$ and $W_n$ into a second bit set 27C, and interleaves the fifth bit $b_5^1, b_5^2, \ldots,$ and $b_5^n$ in each of the weights $W_1$, $W_2, \ldots,$ and $W_n$ into a second bit set 27D.

The processor 12 determines whether each of the second bit sets 27A-27D is compressible. Since the second bit to the fifth bit in each of the second bit sets 27A-27D are the second-type bits that have the potential for substantial compression but do not necessitate protection, the processor 12 compresses each of the second bit sets 27A-27D. In response to the second bit sets 27A-27D being compressible, the processor 12 reads a second compression rate corresponding to the compression of each of the second bit sets 27A-27D. The second compression rate for compressing each of the second bit sets 27A-27D may be the same or different.

For the third-type bits, the processor 12 interleaves the third-type bits (e.g., the sixth bits $b_6^1, b_6^2, \ldots,$ and $b_6^n$) in each of the weights $W_1, W_2, \ldots,$ and $W_n$ into a third bit set 28. The processor 12 determines whether the third bit set 28 is compressible. Since the sixth bit in the third bit set 28 is the third-type bit that is compressible and require protection, the processor 12 compresses the third bit set 28. In response to the third bit set 28 being compressible, the processor 12 reads a third compression rate for compressing the third bit set 28.

For the fourth-type bits, the processor 12 interleaves the fourth-type bits (e.g., the seventh bit to the $m^{th}$ bit) in each of the weights $W_1, W_2, \ldots,$ and $W_n$ into a plurality of fourth bit sets 29. The processor 12 determines whether each of the fourth bit sets 29 is compressible. Since the seventh bit to the $m^{th}$ bit in each of the fourth bit sets 29 are the fourth-type bits that pose challenges for compression but do not necessitate protection or may be even ignored, the processor 12 does not compress each of the fourth bit sets 29.

The processor 12 may determine whether each of the second bit sets 27A-27D and the third bit set 28D is compressible, and if so, the processor 12 reads the second compression rate and the third compression rate. In an embodiment, the processor 12 may determine from the compression rate data stored in the memory 11 whether each of the second bit sets 27A-27D and the third bit set 28D is compressible, and if so, the processor 12 reads the second compression rate and the third compression rate. Here, the compression rate data may be generated based on experimental data or statistical data. In another embodiment, the processor 12 may further dynamically determined based on the compression rate data and according to a distribution condition of 0s and 1s in each of the second bit sets 27A-27D and the third bit set 28 whether each of the second bit sets 27A-27D and the third bit set 28D is compressible, and if so, the processor 12 reads the second compression rate and the third compression rate.

After the processor 12 reads the second compression rate and the third compression rate, the processor 12 compresses each of the second bit sets 27A-27D with the second compression rate and compresses the third bit set 28 with the third compression rate. Then, the uncompressed first bit set 26, the compressed second bit sets 27A-27D, and the compressed third bit set 28 are sequentially coded to generate first encoded data 30 corresponding to the transmission data 21. After the first encoded data 30 are generated by coding, the processor 12 transmits the first encoded data 30 to an external device 3 via a network 2. The network 2 may be a cable communication network or a wireless communication network, and the amount of the first encoded data 30 is much less than the amount of the transmission data 21, which may reduce the use of memory and improve transmission efficiency when exchanging data between a parameter server and a plurality of user equipment (UE) in federated learning, for instance.

In an embodiment, when the parameter server intends to share parameters of the DNN model with a plurality of UE, the data processing system 1 shown in FIG. 2 may serve as the parameter server, and the external device 3 may serve as the UE. In another embodiment, when the UE intends to share the parameters of the DNN model with the parameter server, the data processing system 1 shown in FIG. 2 may serve as the UE, and the external device 3 may serve as the parameter server.

On the contrary, when the data processing system 1 receives second encoded data from the external device 3 via the network 2, the data processing system 1 is also required to decode, decompress, and de-interleave the second encoded data to generate reconstructed weights.

In an embodiment, when the processor 12 of the data processing system 1 receives the second encoded data from the external device 3 via the network 2, the processor 12 decodes the second encoded data to generate the first bit set, the compressed second bit sets, and the compressed third bit set; the processor 12 decompresses each of the compressed second bit sets and the compressed third bit set; the processor 12 sequentially de-interleaves the first bit set, each of the second bit sets, and the third bit set; based on the first bit set, each of the second bit sets, and the third bit set generated after de-interleaving, the processor 12 reconstructs the de-interleaved bits as a plurality of reconstructed weights.

Figure 4A:
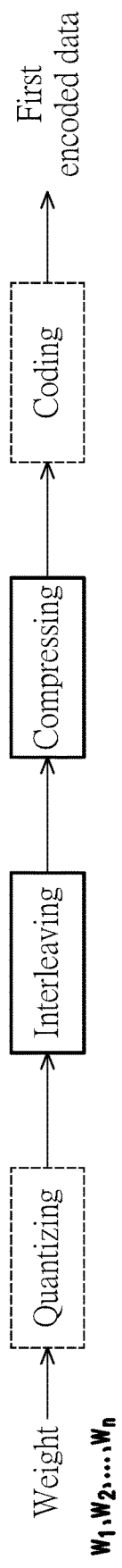
FIG. 4A and FIG. 4B are schematic diagrams illustrating a data processing method according to an embodiment of the disclosure.
Figure 4B:
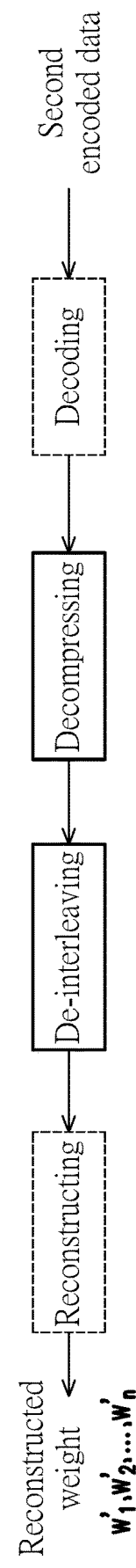

FIG. 4A and FIG. 4B are schematic diagrams illustrating a data processing method according to an embodiment of the disclosure. The data processing method depicted in FIG. 4A corresponds to the schematic diagram illustrating the processing of the transmission data 21 by the data processing system 1 in FIG. 3; that is, the weights $W_1$, $W_2$, ..., and $W_n$ of the transmission data 21 are quantized, interleaved, compressed, and coded to generate the first encoded data 30 corresponding to the transmission data. The data processing method depicted in in FIG. 4B includes decoding, decompressing, and de-interleaving the second encoded data after receiving the second encoded data, so as to generate the reconstructed weights $W'_1$, $W'_2$, ..., and $W'_n$.

Figure 5:
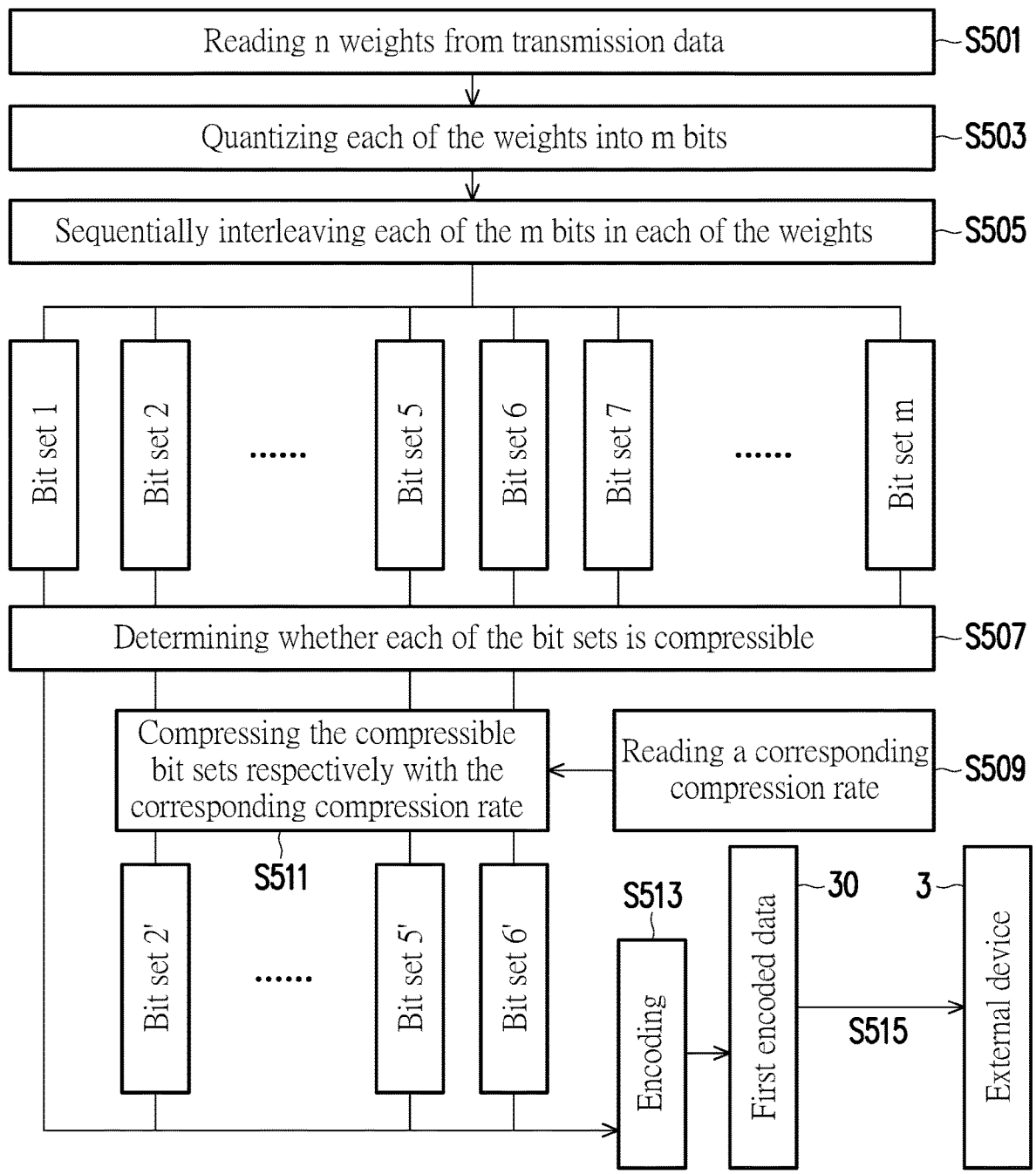
FIG. 5 is a flowchart illustrating a data processing method according to an embodiment of the disclosure.

FIG. 5 is a flowchart illustrating a data processing method 5 according to an embodiment of the disclosure. The steps of the data processing method 5 in FIG. 5 are implemented by the processor 12 in the data processing system 1 as shown in FIG. 2 and may refer to the schematic diagram illustrating the processing of the transmission data 21 by the data processing system 1 in FIG. 3. Therefore, please refer to FIG. 2, FIG. 3, and FIG. 5 together. The steps of the data processing method 5 includes S501, S503, S505, S507, S509, S511, S513, and S515.

In step S501, the processor 12 reads n weights $W_1$, $W_2$, ..., and $W_n$ from the transmission data 21 of the DNN model 110.

In step S503, the processor 12 quantizes each of the weights $W_1$, $W_2$, ..., and $W_n$ into m bits. The m bits sequentially include the first-type bit that is extremely important, non-compressible, and requires protection, a plurality of second-type bits that are extremely important, highly compressible, and requires no protection, the third-type bit that is important, compressible, and requires protection, and the fourth-type bit that is of the lowest importance, poses challenges for compression, requires no protection, and may even not be transmitted.

In step S505, the processor 12 sequentially interleaves each of the m bits in each of the weights $W_1$, $W_2$, ..., and $W_n$ into m bit sets, e.g., a bit set 1 to a bit set m shown in FIG. 5. Relevant details of interleaving each of the bits in each of the weights $W_1$, $W_2$, ..., and $W_n$ into the bit set in step S505 have been explained in the previous description and will not be further elaborated hereinafter.

In step S507, the processor 12 determines whether each of the bit sets is compressible. Specifically, the processor 12 determines the type of each bit in each bit set to decide whether to compress the bit set. In an embodiment, the processor 12 may determine whether each bit set c is compressible according to the compression rate data stored in the memory 11. In another embodiment, the processor 12 may dynamically determine whether each bit set is compressible based on the distribution condition of 0s and 1s in each bit set.

For instance, the processor 12 determines that the bit in the bit set 1 is the first-type bit that is extremely important, non-compressible, and requires protection, the processor 12 determines that the bits in the bit set 2 to the bit set 5 are the second-type bits that are extremely important, highly compressible, and requires no protection, the processor 12 determines that the bit in the bit set 6 is the third-type bit that is important, compressible, and requires protection, and the processor 12 determines that the bits in the bit set 7 to the bit set m are the fourth-type bits that are of the lowest importance, pose challenges for compression, require no protection, and may even not be transmitted.

If the bit set is compressible, in step S509, the processor 12 reads a compression rate corresponding to each compressible bit set. For instance, the processor 12 reads the second compression rate corresponding to each of the bit set 2 to the bit set 5 and reads the third compression rate corresponding to the bit set 6.

Then, in step S511, the processor 12 compresses the bit set 2 to the bit set 5 respectively with the second compression rate corresponding to each of the bit set 2 to the bit set 5 to generate a compressed bit set 2' to a compressed bit set 5' and compresses the bit set 6 with the third compression rate corresponding to the bit set 6 to generate a compressed bit set 6'.

In step S513, the processor 12 sequentially codes the uncompressed bit set 1, the compressed bit set 2' to the compressed bit set 5', and the compressed bit set 6' to generate the first encoded data 30 corresponding to the transmission data 21.

In step S515, the processor 12 transmits the first encoded data 30 to the external device 3 via the network 2.

To sum up, the data processing system and the data processing method for the DNN model, as provided in one or more embodiments of the disclosure, incorporate techniques such as quantization, block-interleaving, lossless compression, channel coding, and the like. These techniques may achieve prediction accuracy similar to that of the original network model while optimizing the utilization of resources for storing/transmitting the DNN model.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A data processing system, comprising:
   a memory, configured to store a deep neural network model; and
   a processor, coupled to the memory and configured to perform following steps:
   reading a plurality of weights from a transmission data of the deep neural network model;
   quantizing each of the weights into a plurality of bits, wherein the bits sequentially comprise a first-type bit, a plurality of second-type bits, a third-type bit, and a plurality of fourth-type bits;
   interleaving the first-type bit in each of the weights into a first bit set;
   sequentially interleaving each of the second-type bits in each of the weights into a plurality of second bit sets, and reading a second compression rate of each of the second bit sets in response to the second bit sets being compressible;
   interleaving the third-type bit in each of the weights into a third bit set, and reading a third compression rate of the third bit set in response to the third bit set being compressible;
   compressing each of the second bit sets with the second compression rate, and compressing the third bit set with the third compression rate;

sequentially coding the first bit set, each of the compressed second bit sets, and the compressed third bit set to generate a first encoded data corresponding to the transmission data; and transmitting the first encoded data to an external device via a network.

2. The data processing system as claimed in claim 1, wherein the processor is further configured to:

receive a second encoded data from the external device;

decode the second encoded data to generate the first bit set, the compressed second bit sets, and the compressed third bit set;

decompress each of the compressed second bit sets and the compressed third bit set;

sequentially de-interleave the first bit set, each of the second bit sets, and the third bit set; and reconstruct a plurality of de-interleaved bits generated after the first bit set, each of the second bit sets, and the third bit set are de-interleaved as a plurality of reconstructed weights.

3. The data processing system as claimed in claim 1, wherein the first-type bit is a most significant bit.

4. The data processing system as claimed in claim 1, wherein the processor is further configured to:

quantize each of the weights into the bits based on an IEEE standard 754 for binary floating-point arithmetic.

5. The data processing system as claimed in claim 4, wherein the first-type bit is a sign bit.

6. The data processing system as claimed in claim 4, wherein the second-type bits and the third-type bit are exponent bias bits.

7. The data processing system as claimed in claim 1, wherein the memory is further configured to store a compression rate data, and the processor is further configured to:

dynamically determine whether the second bit sets and the third bit set are compressible based on the compression rate data and a distribution condition of 0s and 1s in each of the second bit sets and the third bit set, and read the second compression rate and the third compression rate, wherein the compression rate data comprise historical statistics.

8. A data processing method for a deep neural network model, comprising:

reading a plurality of weights from a transmission data;

quantizing each of the weights into a plurality of bits, wherein the bits sequentially comprise a first-type bit, a plurality of second-type bits, a third-type bit, and a plurality of fourth-type bits;

interleaving the first-type bit in each of the weights into a first bit set;

sequentially interleaving each of the second-type bits in each of the weights into a plurality of second bit sets, and reading a second compression rate of each of the second bit sets in response to the second bit sets being compressible;

interleaving the third-type bit in each of the weights into a third bit set, and reading a third compression rate of the third bit set in response to the third bit set being compressible;

compressing each of the second bit sets with the second compression rate, and compressing the third bit set with the third compression rate;

sequentially coding the first bit set, each of the compressed second bit sets, and the compressed third bit set to generate a first encoded data corresponding to the transmission data; and transmitting the first encoded data to an external device.

9. The data processing method as claimed in claim 8, further comprising:

receiving a second encoded data from the external device;

decoding the second encoded data to generate the first bit set, the compressed second bit sets, and the compressed third bit set;

decompressing each of the compressed second bit sets and the compressed third bit set;

sequentially de-interleaving the first bit set, each of the second bit sets, and the third bit set; and reconstructing a plurality of de-interleaved bits generated after the first bit set, each of the second bit sets, and the third bit set are de-interleaved as a plurality of reconstructed weights.

10. The data processing method as claimed in claim 8, wherein the first-type bit is a most significant bit.

11. The data processing method as claimed in claim 8, further comprising:

quantizing each of the weights into the bits based on an IEEE standard 754 for binary floating-point arithmetic.

12. The data processing method as claimed in claim 11, wherein the first-type bit is a sign bit.

13. The data processing method as claimed in claim 11, wherein the second-type bits and the third-type bits are exponent bias bits.

14. The data processing method as claimed in claim 8, further comprising:

dynamically determining whether the second bit sets and the third bit set are compressible based on a compression rate data and a distribution condition of 0s and 1s in each of the second bit sets and the third bit set, and reading the second compression rate and the third compression rate, wherein the compression rate data comprise historical statistics.

* * * * *